United States Patent [19]

Coulmance

[11] Patent Number: 4,835,484
[45] Date of Patent: May 30, 1989

[54] GAIN CONTROL CIRCUIT FOR SUPPRESSING LARSEN EFFECT IN A LOUDSPEAKER TELEPHONE

[75] Inventor: Jean-Pierre R. Coulmance, Osny, France

[73] Assignee: U.S. Philips Corp., New York, N.Y.

[21] Appl. No.: 161,565

[22] Filed: Feb. 18, 1988

[30] Foreign Application Priority Data

Feb. 27, 1987 [FR] France ............................... 87 02660

[51] Int. Cl.$^4$ ............................................... H03G 3/20
[52] U.S. Cl. .................................... 330/138; 330/141; 379/390; 379/420
[58] Field of Search ............... 330/138, 141, 281, 280; 379/390, 392, 395, 420; 381/71, 83, 93, 94, 95, 96, 120, 121

[56] References Cited

U.S. PATENT DOCUMENTS 4,488,007 12/1984 Chataignon et al. ............... 379/395

FOREIGN PATENT DOCUMENTS 2537810 6/1984 France .
2110905 6/1983 United Kingdom .

Primary Examiner—James B. Mullins
Attorney, Agent, or Firm—Bernard Franzblau

[57] ABSTRACT

A gain control circuit (10) of an amplifier (3) for listening via a loudspeaker (4) in an apparatus, more specifically a telephone set, which includes a microphone (1), in order to suppress the Larsen effect. The gain control circuit comprises first control means (100) which control a first gain reduction of the amplifier (3) when the amplitude of the microphone signal (S) exceeds a first predetermined threshold determined by a first reference voltage VR1, in dependence on a first time constant (RD1+RD2.C). The gain control circuit also includes second control means (200) which start operating only after the said first time constant, and provide a supplementary reduction of the gain depending on a second time constant (RD2.C) which is shorter than the first time constant, as long as the amplitude of the microphone signal (S) exceeds a second threshold, which is lower than the first threshold, determined by a second reference voltage VR2.

10 Claims, 2 Drawing Sheets

GAIN CONTROL CIRCUIT FOR SUPPRESSING LARSEN EFFECT IN A LOUDSPEAKER TELEPHONE

BACKGROUND OF THE INVENTION

The present invention relates to a gain control circuit of an amplifier for listening via a loudspeaker in an apparatus further including a microphone and its associated amplifier, more specifically with a view to suppressing the Larsen effect, the circuit essentially consisting of a negative feedback loop reducing the gain of the amplifier for listening via a loudspeaker when the signal coming from the microphone exceeds a predetermined threshold.

The invention also relates to the use of this gain control circuit in a loudspeaking telephone set. It is a known practice that in all systems comprising both a loudspeaker, fed by its amplifier, and a microphone, whose signal is applied more or less directly to the amplifier, there is a risk of oscillation caused by the Larsen effect due to the acoustic coupling between the loudspeaker and the microphone. This is the case, for example, in a loudspeaking telephone set, to which case the invention refers more particularly, but not exclusively.

In a loudspeaking telephone set it is necessary to provide means for suppressing the state of oscillation due to the Larsen effect and it is highly desirable that this suppression occurs automatically by a considerable reduction of the gain of the loudspeaker amplifier, that is to say without the user of the telephone set having to carry out any operation.

Various technical solutions have already been proposed. Generally speaking, it can be stated that these solutions consist in providing on the one hand a circuit for detecting the state of oscillation due to the Larsen effect, supplying at the output a control signal which can be of the "all or nothing" type, or the proportional type, and on the other hand a so-called control circuit which influences the variable gain preamplifier stage and causes a reduction, or else a total cancelling of the gain when the circuit for detecting the Larsen effect has established that a state of oscillation exists.

An embodiment of a loudspeaking telephone set and gain control is represented in the French Patent Application FR-A-No. 2 537 810.

Essentially, however, such an arrangement is still subject to relaxation because, after an oscillation, a first gain reduction can make this oscillation disappear, whereas a moment later the gain control will increase again so that a second oscillation occurs, etc.

It will be readily understood that there is no simple solution to realize the desired function, and the more so as the circuit for detecting the Larsen effect must be very selective in distinguishing an oscillation signal from a high amplitude but temporary audio signal such as an ambient noise or an impact on the microphone.

SUMMARY OF THE INVENTION

An object of the invention is to provide a suitable gain control circuit of the listening amplifier connected in the loudspeaker channel, which avoids the relaxation and which could use circuits that can essentially be integrated.

According to the invention, this object is achieved by means of a control circuit in accordance with the opening paragraph, characterized in that the negative feedback loop comprises a first control means for controlling a gain reduction of the listening amplifier in the loudspeaker channel with a first time constant, and the said predetermined threshold being a first threshold, also includes second control means for comparing the signal coming from the microphone to a second threshold, lower than the said first threshold. The second control means control a gain reduction with a second time constant lower than the first one, from the moment when the gain is reduced to below a reference gain value by the said first control means, whereas they remain inactive when the gain remains higher than the said reference value.

When there is no Larsen oscillation, the said first control means are generally sufficient to suitably attenuate the amplification of the listening signal in the loudspeaker channel, if this is necessary, and to ensure the adjustment of the amplification in the usual manner.

The whole acoustic signal which reaches the microphone at a high level but for a short period of time, that is to say a time period which is shorter than the first time constant, does not trigger the second control means, as opposed to the instability caused by the Larsen effect which produces, by acoustic coupling, a high microphone signal and generally for a considerable length of time depending on the conditions of the acoustic coupling between the loudspeaker and the microphone. The moment when the first control means has reduced the gain to below the predetermined value taken as a reference, which occurs after the first time constant, the second control means come into operation having an adjusted time constant which is distinctly lower than the time constant of the first control means, and the gain is reduced rapidly to the value required so that the adjustment is effected by comparison to the second threshold. As the second threshold is chosen to have a lower value than the first threshold, relaxation will only occur and the circuit will only return to the normal gain conditions when the signal from the microphone becomes lower than the second threshold, or in practice, when the cause of the oscillation has disappeared.

In an embodiment which is advantageous in its simplicity, the gain control circuit is characterized in that the gain of the listening amplifier coupled to the loudspeaker is controlled by the charging voltage of a capacitor permanently charged through a current source, and in that the first and second control means have outputs which cause this capacitor to be discharged via a respective first and second discharge resistor. The first discharge resistor has a value which is higher than that of the second discharge resistor.

In addition, in this embodiment the control circuit is characterized in that the capacitor is charged from the most positive potential in the circuit, in that the said first and the second control means discharge the capacitor by their output terminal which is of the NPN transistor type (or N-channel MOS), with an open collector (or open drain), and in that the first discharge resistor of the capacitor is arranged in series with the second discharge resistor. The transistors of this type have the advantage of being easy to integrate.

The use of outputs of the open collector type makes it possible to couple the outputs of the first and second control means across their respective discharge resistor because the state of high impedance of the output of one of the control means has no effect on the outupt of the other control means.

According to the invention, one variant of this embodiment dispenses with the use of discharge resistors when the first and second control means have their outputs operate at a discharge current which is confined to a fixed value. The output current of the first means is then fixed at a lower value than the output current of the second control means, and the outputs concerned are connected in parallel to the capacitor.

A particular embodiment of the invention is characterized in that the first control means comprise a first comparator whose positive input receives the signal coming from the microphone after amplification, whose negative input is brought to a first reference voltage which is lower than the continuous level of the signal coming from the microphone, and defines said first threshold with respect to this level, and whose output constitutes the output of the said first control means, in that the second control means comprise a second, a third and a fourth comparator, all of them having an output of the NPN transistor type having an open collector, in that the second comparator has its negative input, which receives the signal coming from the microphone after amplification, and its positive input, which is brought to a second reference voltage slightly higher than the first reference voltage but lower than the continuous level of the signal coming from the microphone, and which defines the said second threshold with respect to this level, in that the output of the second comparator is connected on the one hand to the intermediate point of a first impedance bridge which is connected between the end terminals of the circuit, and on the other hand to the negative input of the third comparator, in that the fourth comparator receives on its positive input a voltage substantially equal to the charging voltage of the capacitor and has its negative input brought to a third reference voltage level corresponding to the voltage offered by the capacitor for the said reference gain value, in that the output of the fourth comparator is connected to the foot of a second impedance bridge whose head is connected to the most positive voltage supply and whose intermediate point is connected to the positive input of the third comparator and makes a fourth reference voltage apppear, when the output of the fourth comparator is in a low state, which voltage is adjusted to a value which is lower than the voltage of the intermediate point of the first impedance bridge when the output of the second comparator is in the high-impedance state, and in that the output of the third comparator constitutes the output of the said second control means.

With the exception of the capacitor whose voltage controls the gain of the amplifier for listening via a loudspeaker, the components constituting the control circuit can be integrated, which leads to a particularly cost-effective circuit.

BRIEF DESCRIPTION OF THE DRAWINGS

The following description in connection with the annexed drawings will describe in detail how the invention can be realized, in which drawings.

DESCRIPTION OF THE PREFERRED EMBODIMENTS

Figure 1:
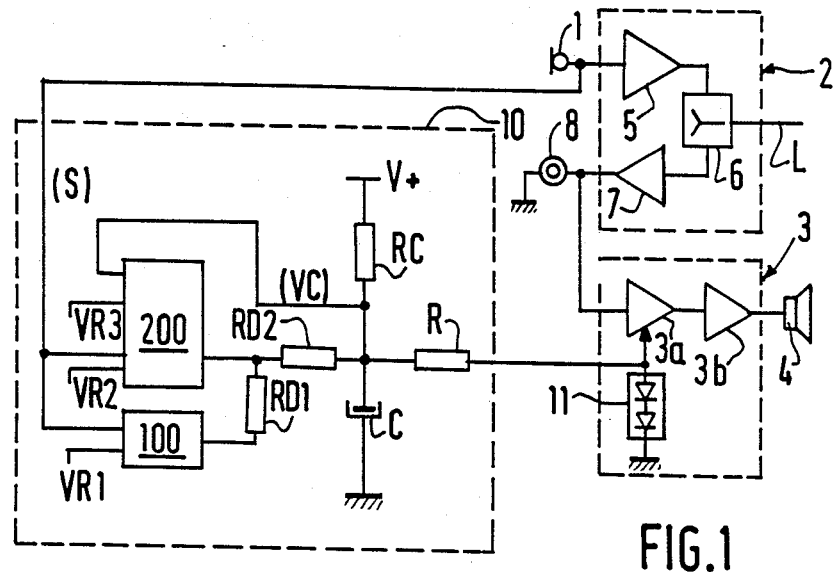
FIG. 1 shows a block diagram of the control circuit according to the invention as used in a loudspeaking telephone set.

FIG. 1 shows the general circuit diagram of an apparatus compising a microphone 1, an amplifier circuit 2 and a signal processing circuit 3, and a loudspeaker 4. In the particular case of a telephone set the block denoted 2 comprises a preamplifier 5 for the microphone signal, a separator module 6, also called a hybrid junction, connected to the telephone line L and a listening preamplifier 7 for the receiver 8 of the combination. The block denoted 3 ensures the amplification of the listening signal in order to feed the loudspeaker 4, and comprises a preamplifier stage 3a having a controllable gain and a power amplifier stage 3b having a fixed gain.

Depending on the circumstances, an acoustic coupling can take place between the loudspeaker 4 and the microphone 1, which is capable of bringing about an instability known by the name of the Larsen effect. In order to suppress this undesirable effect or attenuate the consequence thereof considerably, there is provided a gain control circuit 10 of the listening amplifier 3a contained in the block 3. The gain control circuit 10 roughly behaves as a negative feedback loop. Its input signal S can be taken off at any point in the amplifier circuit between the microphone 1 and the loudspeaker 4, but it should preferably be taken off at the microphone 1, more specifically in the case of a telephone set. According to the invention, the signal S, after a possible amplification, is applied to the input of the first control means 100 which effect a comparison of the signal S to a first reference voltage VR1.

The gain control circuit 10 also includes a capacitor C having one terminal connected to grund and the other terminal charged from the positive potential V+ through a charging resistor RC. The charging voltage VC of this capacitor C can be limited, if desired, by a voltage limiter 11 constituted, for example, by a specific number of semiconductor junctions in the forward direction, a situation which can exist by providing the preamplifier stage 3a at the gain control input. The voltage VC serves to control the gain of the amplifier 3 and can be converted into the control current by means of a resistor R as shown in the Figure. The capacitor C can be discharged by the output of the first control means 100 through a first discharging resistor RD1, and a second discharging resistor RD2 connected in series. The quiescent voltage of the signal S determines, with respect to the first reference voltage VR1, a first threshold which, when not exceeded, maintains the output of the first control means 100 at the high-impedance state, while the output of these control means is of the open collector type. When the first threshold is exceeded, the output of the first control means 100 changes to the low-impedance state and causes capacitor C to be discharged through the discharging resistors RD1 and RD2 in dependence on a first time constant which is equal to (RD1+RD2). C.

The signal S is also applied to the input of the second control means 200, and this signal is compared to a second reference voltage VR2. The output of second control means 200 is connected to the intermediate point between the discharging resistors RD1 and RD2. The second reference voltage VR2 is chosen such that, together with the quiescent voltage of the signal S, it forms a second threshold which is lower than the said first threshold. As will be described in greater detail hereinbelow, the second control means 200 are also controlled from the charging voltage VC of the capacitor C, and the output of the second control means is only activated when the voltage VC has dropped below one third of the reference voltage VR3 corresponding to the voltage carried by the capacitor C for a reduced gain value which serves as a reference. Thus, the second control means 200 only produces a gain reduction of the power amplifier from the moment when the first control means have already reduced the gain to below the said reference value. In that case, the output of the second control means 200, which is also of the open collector type, causes capacitor C to be discharged through the discharging resistor RD2, preferably chosen to have a value which is much lower than that of the first discharging resistor RD1, and thus in dependence on a second time constant which is much shorter than the first time constant of the first control means 100. If the signal S of the microphone maintains a relatively high amplitude, that is to say higher than the second threshold determined by the second reference voltage VR2, the gain of the amplifier for listening 3 will be controlled by the second control means 200.

In contradistinction thereto, when the amplitude of the signal S again drops below the second threshold, and thus even further below the first threshold, the two outputs of the first and second control means are in the high-impedance state and consequently, the capacitor C is recharged through the resistor RC and the gain of the amplifier for listening 3 will return to a high nominal value.

It has been indicated above that different thresholds for the operation of the control means 100 and 200 are obtained from the reference voltages VR 1 to VR 3. However, it will be evident that an equivalent solution can be obtained from a variant of an embodiment (not shown), operating on a current and not on a voltage, in which the thresholds required for the operation of the control means 100 and 200 are defined by currents of a preset value.

Analogously, a further variant of the embodiment (not shown) relates to the discharging resistors RD 1 and RD 2 which can be suppressed when the outputs of the control means 100 and 200 operate with a fixed current while being in the conducting state.

According to this variant, a value has been chosen for the output current of the first control means 100 which is preferably much lower than the current value of the output of the second control means.

Figure 2:
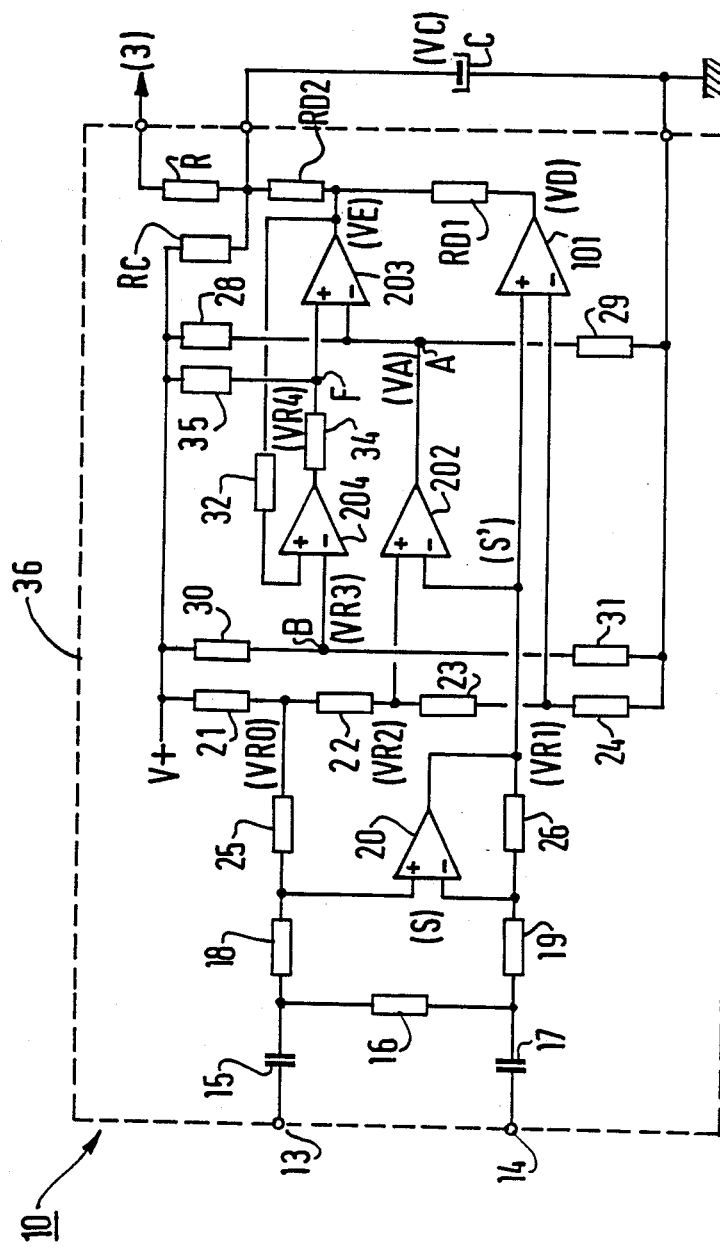
FIG. 2 shows a more detailed diagram of the control circuit according to the invention, and FIG. 3 provides a diagram showing the voltages as a function of time at various points in the circuit of FIG. 2.

FIG. 2 a more detailed diagram of an embodiment the control circuit 10 of FIG. 1.

The two terminals of the microphone are connected to two input terminals 13 and 14 of the control circuit 10. The continuous reference of the microphone signal is first eliminated by a pi-filter constituted by the series arrangement of the capacitor 15 the resistor 16 and the capacitor 17. The microphone signal thus filtered is applied to the inputs of a differential amplifier 20 via the protective resistors 18 and 19.

Between the positive supply voltage V+ and the reference voltage (ground) is inserted a chain of four resistors 21, 22, 23, 24, which determine a first reference voltage VR1 at the junction between the resistors 24 and 23, a second reference voltage VR2 at the junction between the resistors 23 and 22 and a main reference voltage VRO at the junction between the resistors 22 and 21. The main reference voltage VRO is applied to the positive input of the differential amplifier 20 through a protective resistor 25 and the negative input of this differential amplifier is looped back to its output via a negative feedback resistor 26.

Finally, the signal which is denoted S' in the Figure, and which is the microphone signal amplified by the differential amplifier 20, has a DC level which is substantially equal to the main reference voltage VRO. By way of a practical example, the gain of the differential amplifier 20 is set at around 50, the reference voltages VR0, VR1 and VR2 are set at around half the voltage V+, while the reference voltage VR1 is approximately 12 millivolts lower than the main reference voltage VR0, which difference constitutes the said first threshold, and the second reference voltage VR2 is 1.5 millivolts lower than the main reference voltage VR0, and constitutes the said second threshold which is eight times lower than the first threshold.

The signal S' coming from the microphone, after amplification, is applied to the positive input of a first comparator 101 having an open collector output and whose negative input receives the first reference voltage VR1. The signal S' is also applied to the negative input of a second comparator 202 having an open collector, while a positive input thereof receives the second reference voltage VR2. The output of the comparator 202 is connected to the intermediate point A between a divider constituted by the resistor 28, further connected to the positive voltage V+, and the resistor 29 connected to ground. The values of the resistors 28 and 29 are chosen such that the voltage VA of the point A is slightly higher than half the positive voltage V+. A third comparator 203 having an open collector output has its negative input connected to the point A. A fourth comparator 204 having an open collector output has its negative input connected to a third reference voltage VR3 carried by the intermediate point B of a resistor divider 30 and 31, which respective resistors are connected to the positive voltage V+ and ground. The third reference voltage VR3 corresponds to the voltage which the capacitor C has for a certain reference gain value below which the second control means have to start operating, as will be explained hereinafter. According to the explanation given with respect to FIG. 1, the capacitor C is charged permanently from the positive voltage supply V+ through the charging resistor RC, and is optionally discharged, depending on the circumstances, via the outputs of the first comparator 101 and the third comparator 203 through the discharge resistors RD1 and RD2, respectively, the series arrangement of which is connected to the junction point between charging resistor RC and the capacitor C. The output of the third comparator 203 which, when in a high-impedance state, carries a voltage which is substantially equal to the charging voltage of the capacitor C, is connected via a protective resistor 32 to the positive input of the fourth comparator 204. Finally, the output of the fourth comparator 204 is connected to the foot of a bridge, constituted by the resistors 34 and 35, whose top is connected to the positive voltage supply V+ and whose intermediate point F makes a fourth reference voltage VR4 appear which, when the output of the fourth comparator 204 is in the low-impedance state, is adjusted to a value which is lower than the voltage VA of point A when the output of the second comparator 202 is in the high-impedance state. The intermediate point F of the resistors 34 and 35 is connected to the positive input of the third comparator 203.

Figure 3:
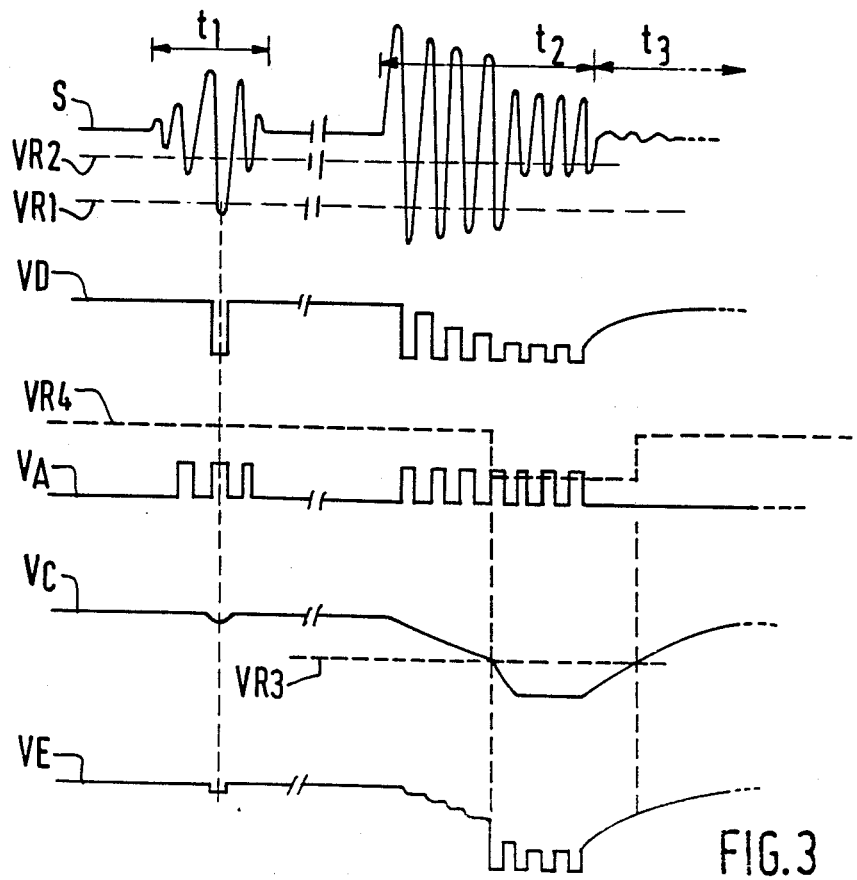

With reference to FIG. 3, the operation of the gain control circuit 10 of FIG. 2 will now be described. FIG. 3 shows on the one hand the signal S' coming from the microphone after amplification, in comparison with the first reference voltage VR1 and the second reference voltage VR2, and on the other hand the signals:

VD at the output of the first comparator 101

VA, the voltage at point A, in comparison with the voltage VR4

VC, the charging voltage of capacitor C, in comparison with the voltage VR3, and VE, the voltage at the output of the third comparator 203.

It should be noted with respect to this Figure that, for convenience sake, the signals shown are on a scale totally arbitrary and non-proportioned. A first period of time t1 is shown during which the signal S' has a momentarily high amplitude which is a characteristic feature of the speech signal. It will be remembered that the speech signal can be characterized by a peak factor which is substantially in accordance with the following law:

$$\theta = (\pi/Ln2) \exp(-x\sqrt{3/2})$$

in which x represents the ratio between the absolute value of a given threshold and the effective voltage of the signal, and $\theta$ represents the sum of the periods of time during which this threshold is exceeded relative to the total time of observation. The control circuit 10 utilizes this characteristic feature of the speech signal.

During this period of time t1, the first comparator 101 has an output which changes to the low state when the first reference voltage VR1 is exceeded and progressively effects through the discharge resistor RD1 having a relatively high value, the charge volgage VC of the capacitor C. During the same period of time the second reference voltage VR2 is also exceeded so that the second comparator 202 provides an output signal VA which, in a condition of rest is in the low state, and comprises square waves for the corresponding alternations of the signals S'. However, the fourth comparator 204, as it has not changed-over the voltage VR4 at the point F, is maintained at the highest potential V+. Thus, the third comparator 203 does not change-over during this period of time t1.

FIG. 3 also shows another period of time, t2, during which a condition of acoustic coupling occurs such that the system oscillates, whereas the conditions of oscillation have disappeared for the next period of time t3. During a first time interval corresponding to the first discharging time constant, due to the operation of the comparator 101 and the first discharging resistor RD1, the gain of the amplifier for listening 3 is progressively reduced under the influence of the comparator 101, until the charging voltage of the capacitor VC drops to below the third reference voltage VR3. At this instant, the fourth comparator 204 changes-over, and at point F a reference voltage VR4 appears which is lower than the top of the positive square waves of the signal VA at the output of comparator 202. From that instant onwards the third comparator 203 is able to change-over in response to the positive square waves of the output of the second comparator 202 and in its low-state output leads to an accelerated discharging of the capacitor C in response to the discharging resistor RD2 chosen to have a distinctly lower value than resistor RD1. The gain then changes rapidly to a very low value in response to the voltage control of the capacitor C, and the circuit then adjusts the value of this gain as a function of the conditions and the amplitude of the signal S' as long as the latter has an amplitude such that the second reference voltage VR2 remains exceeded by the negative alternations of this signal.

During the third period of time t3, during which the acoustic coupling conditions have been changed, the signal S' is supposed to be reduced to a low value such that neither of the two thresholds is exceeded. The outputs of the first comparator 101 and the third comparator 203 are now in the high-impedance state so that the capacitor C is recharged through charging resistor RC. When the charging voltage VC of capacitor C exceeds the level of the third reference voltage VR3 at point B, the output of the fourth comparator 204 is again switched to the high-impedance state so that the voltage at point F is again increased to the value of the positive voltage V+. The unit comprising comparators 202, 203 and 204 returns to its stable operating point when there is no high amplitude of the signal S'.

Finally, it should be observed that the comparator 101, when playing the role of first control means, operates according to a first time constant which is mainly determined by the discharge resistor RD1 as long as the signal S' maintains an amplitude value which can be adjusted by the first control means without the gain being reduced to below the reference gain corresponding to the third reference voltage VR3.

When the microphone signal has a high amplitude (the two thresholds being exceeded), the capacitor C is discharged according to he said first time constant after which the unit comprising the comparators 202, 203 and 204 starts operating with a time constant caused by the discharge resistor RD2 which can be chosen, for example, to be 20 times lower than the discharge resistor RD1, and this unit of comparators constituting the second control means, then adjusts the discharge of the capacitor and thus the gain of the amplifier 3 as long as the signal S' maintains an amplitude which exceeds the second threshold corresponding to the second reference voltage VR2.

The portion of the circuit 10 of FIG. 2, which is shown inside the broken line framework 36, can easily be integrated in the form of a monolithic circuit. In order to facilitate this operation, specific resistors of a high value can advantageously be exchanged for components having equivalent functions. Thus, the first impedance divider, described as being constituted by the resistors 28 and 29, can, according to a variant which is not shown in the Figure, be constituted by the series arrangement of a current source connected to the voltage supply V+ and of a non-linear impedance connected to ground, this non-linear impedance being formed by a plurality of semiconductor junctions connected in series, which normally determine the voltage VA of point A. This also holds for the second impedance divider described hereinbefore as formed by the resistors 34 and 35 and also for the divider formed by the resistors 30 and 31. In a similar manner the resistor 21 can be exchanged for a current source and the resistor 24 for a series of semiconductor junctions connected in the forward direction, while the resistors 22 and 23, having a lower value, can be retained.

Finally, as experts who effect the integration of electronic functions by means of monolithic circuits know, variants can be proposed in which the functions that have been described in terms of voltage comparisons are transformed into equivalent functions using a comparison of currents. It will be evident that such variants remain within the scope of the invention claimed hereinafter.

What is claimed is:

1. A gain control circuit of an amplifier for listening via a loudspeaker in an apparatus further including a microphone and its associated amplifier, more specifically for suppressing the Larsen effect, the circuit comprising, a negative feedback loop for reducing the gain of the listening amplifier when a signal coming from the microphone exceeds a first predetermined threshold, the negative feedback loop comprising first control means for controlling a gain reduction of the listening amplifier with a first time constant, second control means for comparing the signal coming from the microphone to a second threshold, lower than said first threshold, which second control means control a gain reduction with a second time constant shorter than the first time constant and from a moment when the gain is reduced to below a reference gain value by the said first control means, said second control means being inactive when the gain remains higher than the said reference gain value.

2. A gain control circuit as claimed in claim 1, characterized in that the gain of the listening amplifier is controlled by the voltage of a capacitor permanently charged via a current source, and in that the first and second control means have respective outputs coupled to said capacitor which cause said capacitor to be discharged via respective first and second discharge resistors, the first discharge resistor having a resistance value which is higher than that of the second discharge resistor.

3. A gain control circuit as claimed in claim 2, characterized in that the capacitor is charged from a most positive potential in the circuit, in that said first and second control means discharge the capacitor by their output terminal, and in that the first discharge resistor is arranged in series with the second discharge resistor.

4. A gain control circuit as claimed in claim 3 characterized in that: the first control means comprise a first comparator whose positive input receives the microphone signal, whose negative input is coupled to a first reference voltage which is lower than the continuous level of the microphone signal and defines said first threshold, with respect to said level, and whose output constitutes the output of said first control means, in that the second control means comprise a second, a third and a fourth comparator, in that the second comparator has a negative input which receives the microphone signal and a positive input coupled to a second reference voltage slightly higher than the first reference voltage but lower than the continuous level of the microphone signal and which defines said second threshold with respect to said level, in that the output of the second comparator is connected to an intermediate point of a first impedance bridge connected between a most positive and a most negative voltage supply of the circuit, and to a negative input of the third comparator, in that the fourth comparator receives at its positive input a voltage substantially equal to the voltage of the capacitor and has a negative input coupled to a third reference voltage level corresponding to the voltage offered by the capacitor for said reference gain value, in that the output of the fourth comparator is connected to one end of a second impedance bridge whose other end is connected to the most positive voltage supply and whose intermediate point is connected to a positive input of the third comparator and produces a fourth reference voltage when the output of the fourth comparator is in a low-state, which voltage is adjusted to a value which is lower than the voltage of the intermediate point of the first impedance bridge when the output of the second comparator is in a high-impedance state, and in that the output of the third comparator constitutes the output of said second control means.

5. A gain control circuit as claimed in claim 1, characterized in that the gain of the listening amplifier is controlled by the voltage of a capacitor permanently charged via a current source, and in that the first and second control means cause the capacitor to discharge by means of a current whose value is preset at the output of each of said control means, the output current of the first control means being fixed at a lower value than the value of the output current of the second control means, and wherein said outputs are connected in parallel to the capacitor.

6. A gain control circuit as claimed in claim 5, characterized in that the first control means comprise a first comparator whose positive input receives the microphone signal, whose negative input is coupled to a first reference voltage which is lower than the continuous level of the microphone signal and defines said first threshold, with respect to said level, and whose output constitutes the output of said first control means, in that the second control means comprise a second, a third and a fourth comparator, in that the second comparator has a negative input which receives the microphone signal and a positive input coupled to a second reference voltage slightly higher than the first reference voltage but lower than the continuous level of the microphone signal and which defines said second threshold with respect to said level, in that the output of the second comparator is connected to an intermediate point of a first impedance bridge connected between a most positive and a most negative voltage supply of the circuit, and to a negative input of the third comparator, in that the fourth comparator receives at its positive input a voltage substantially equal to the voltage of the capacitor and has a negative input coupled to a third reference voltage level corresponding to the voltage offered by the capacitor for said reference gain value, in that the output of the fourth comparator is connected to one end of a second impedance bridge whose other end is connected to the most positive voltage supply and whose intermediate point is connected to a positive input of the third comparator and produces a fourth reference voltage when the output of the fourth comparator is in a low-state, which voltage is adjusted to a value which is lower than the voltage of the intermediate point of the first impedance bridge when the output of the second comparator is in a high-impedance state, and in that the output of the third comparator constitutes the output of said second control means.

7. A gain control circuit as claimed in claim 1 wherein said capacitor is discharged via respective output circuits of the first and second control means and said first discharge resistor is connected in series with the second discharge resistor.

8. A gain control circuit for an audio amplifier coupled to a loudspeaker in an apparatus that also includes a microphone, said gain control circuit comprising: a negative feedback circuit having an input for receiving a microphone signal and an output coupled to a gain control input of the audio amplifier, said negative feedback circuit comprising first control means for controlling a gain reduction of the audio amplifier with a first time constant when the microphone signal achieves a first predetermined threshold value, wherein the negative feedback circuit further comprises second control means for comparing the microphone signal with a second threshold value lower than said first threshold value, said second control means controlling a gain reduction of the audio amplifier with a second time constant shorter than said first time constant if the amplifier gain is reduced below a given reference gain value by said first control means, said second control means being inoperative so long as the amplifier gain is above said given reference gain value.

9. A gain control circuit as claimed in claim 8 wherein said negative feedback circuit further comprises, a capacitor coupled to a source of DC voltage for charging the capacitor, first and second discharge resistors coupled to the capacitor and to respective output circuits of the first and second control means for selectively providing first and second discharge paths for the capacitor having said first and second time constants, respectively, and wherein said capacitor is connected to said output of the negative feedback circuit for producing a gain control signal at said output.

10. A gain control circuit as claimed in claim 9 wherein said first and second discharge resistors are connected in series between the capacitor and the output circuit of the first control means and with a junction point therebetween coupled to the output circuit of the second control means.

* * * * *